(12) United States Patent
Van Haren et al.

(10) Patent No.: US 7,629,697 B2
(45) Date of Patent: Dec. 8, 2009

(54) MARKER STRUCTURE AND METHOD FOR CONTROLLING ALIGNMENT OF LAYERS OF A MULTI-LAYERED SUBSTRATE

(75) Inventors: Richard Johannes Franciscus Van Haren, Waalre (NL); Arie Jeffrey Den Boef, Waalre (NL); Jacobus Burghoorn, Haelen (NL); Maurits Van Der Schaar, Veldhoven (NL); Bartolomeus Petrus Rijpers, Nuenen (NL)

(73) Assignee: ASML Netherlands B.V., Veldhoven (NL)

( * ) Notice: Subject to any disclaimer, the term of this patent is extended or adjusted under 35 U.S.C. 154(b) by 1117 days.

(21) Appl. No.: 10/986,179

(22) Filed: Nov. 12, 2004

(65) Prior Publication Data

US 2006/0103033 A1   May 18, 2006

(51) Int. Cl.
*H01L 23/544* (2006.01)
*H01L 21/76* (2006.01)
*H01L 21/78* (2006.01)
*H01L 21/46* (2006.01)
*G01B 11/00* (2006.01)

(52) U.S. Cl. .............................. 257/797; 257/E23.179; 438/401; 438/462; 356/401

(58) Field of Classification Search .................. 257/797, 257/E23.179; 438/401, 462; 356/401
See application file for complete search history.

(56) References Cited

U.S. PATENT DOCUMENTS 6,417,922 B1   7/2002   Dirksen et al.
6,819,426 B2 *  11/2004  Sezginer et al. ............. 356/401
6,937,344 B2    8/2005  Monshouwer et al.
7,193,715 B2 *   3/2007  Smedt et al. ................. 356/401
7,230,704 B2 *   6/2007  Sezginer et al. ............. 356/401
2002/0149782 A1 * 10/2002 Raymond .................... 356/616
2003/0224261 A1  12/2003  Schulz
2004/0137651 A1   7/2004  Smedt et al.
2004/0229471 A1 * 11/2004  Abdulhalim et al. ........ 438/736

FOREIGN PATENT DOCUMENTS

| JP | 2004-279405 A | 10/2004 |
| WO | WO 02/25723 A2 | 3/2002 |
| WO | WO 02/084213 A1 | 10/2002 |
| WO | 2004/107415 A1 | 12/2004 |

OTHER PUBLICATIONS

English translation of Japanese Official Action issued on Dec. 11, 2008 in Japanese Application No. 2005-327563.

* cited by examiner

*Primary Examiner*—Luan C Thai
(74) *Attorney, Agent, or Firm*—Pillsbury Winthrop Shaw Pittman LLP (57) ABSTRACT

The invention includes a lithographic system having a first source for generating radiation with a first wavelength and an alignment system with a second source for generating radiation with a second wavelength. The second wavelength is larger than the first wavelength. A marker structure is provided having a first layer and a second layer. The second layer is present either directly or indirectly on top of said first layer. The first layer has a first periodic structure and the second layer has a second periodic structure. At least one of the periodic structures has a plurality of features in at least one direction with a dimension smaller than 400 nm. Additionally, a combination of the first and second periodic structure forms a diffractive structure arranged to be illuminated by radiation with the second wavelength.

6 Claims, 6 Drawing Sheets

MARKER STRUCTURE AND METHOD FOR CONTROLLING ALIGNMENT OF LAYERS OF A MULTI-LAYERED SUBSTRATE

FIELD OF THE INVENTION

The invention relates to the field of lithography.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

Two basic requirements for a lithographic apparatus are to image the desired pattern on the substrate as intended and to position the desired pattern within a certain accuracy with respect to a previous patterned layer on the substrate. The last requirement is referred to as "overlay".

Generally an overlay error is determined by measuring an overlay marker structure positioned at a certain location on a substrate. The overlay marker structure comprises an overlay target in a first layer and an overlay target in a second layer positioned above the first layer. The overlay is determined by identifying a differential position i.e. a difference in position between the overlay target in the first layer and the overlay target in the second layer. However, several problems with this type of overlay determination arise.

Generally, overlay targets in a layer are manufactured in parallel with the pattern structures of that layer. However, during processing, several process steps may deteriorate the overlay targets. Unfortunately, this deterioration often leads to an asymmetric deformation of an overlay marker structure of the prior art. The asymmetry causes an inaccurate determination of the overlay. Especially in future lithographic applications, this decrease in accuracy may have dramatic consequences. Because, as the dimensions of the pattern structures become smaller and smaller, the requirements for parameters like overlay increase accordingly.

Figure 2:
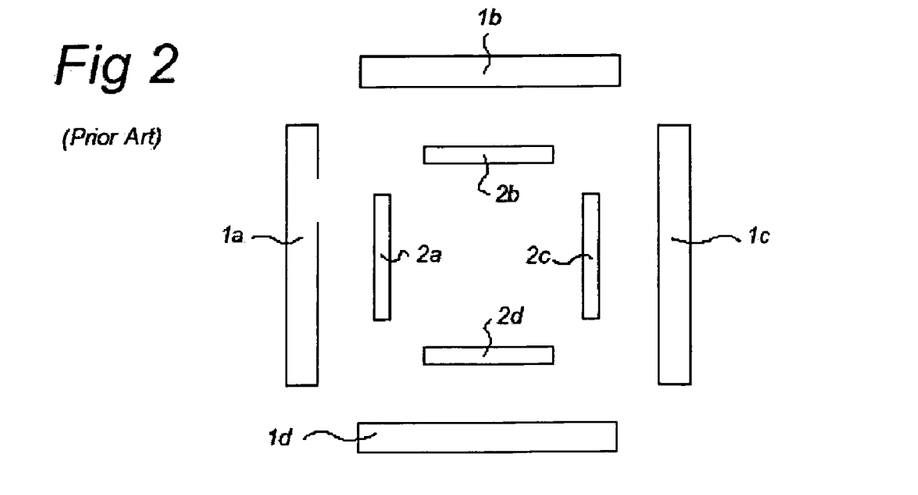
FIG. 2 shows a state-of-the-art overlay marker structure.

Another problem with the determination of overlay lies in the dimensions of a state-of-the-art overlay marker structure. A prior art overlay marker structure, as shown in FIG. 2, comprises features with dimensions several times larger than the exposure wavelength of the lithographic apparatus, i.e. the features are not "at resolution".

Furthermore, a prior art overlay marker structure generally comprises only bar-like structures in the overlay targets of both layers. It is however well-known that different structures will be affected differently by the optics provided in a lithographic apparatus. For instance, a well-known combination in the art is a device layer comprising bar-like structures called gates and a contact layer comprising apertures called contact holes. Effects of aberrations and distortions, induced by optical elements like projection lenses and/or mirrors, are different for contact holes and bars. As a result, if both layers include bar shaped overlay targets, the overlay marker structure may reveal a perfect alignment. However, pattern structures on the layers may include gates and contact-holes that are not well-aligned when a contact layer is positioned on top of a device layer. Thus, the measured overlay on the overlay target will be different from the actual overlay between the pattern structures.

Finally, in lithographic processing, it is desirable to be able to determine an overlay error as early as possible, and moreover, to compensate for misalignment in the process at an early stage. However, an overlay error between two layers is generally determined off line, i.e. in a separate apparatus not directly connected to the production line of an integrated circuit, by employing some kind of metrology technique. Moreover, often the measurements are performed after the processing of a number of substrates. Other problems exist.

SUMMARY

The invention provides a marker structure for use in a lithographic system that includes a first source for generating radiation having a first wavelength and an alignment system with a second source for generating radiation having a second wavelength, the second wavelength being larger than the first wavelength. The marker structure includes at least a first layer and a second layer, the second layer being on top of the first layer. The first layer has a first periodic structure and the second layer has a second periodic structure, wherein at least one of the first and second periodic structures comprises a plurality of features in at least one direction with a dimension smaller than 400 nm, and wherein a combination of the first and the second periodic structure forms a diffractive structure arranged to be illuminated by radiation with the second wavelength. The second wavelength typically falls in the range 400-1000 nm.

The invention further relates to a device comprising such a marker structure.

The invention further relates to a method for manufacturing such a marker structure.

The invention further provides a method in a lithographic system for controlling alignment of layers of a multi-layered substrate having at least a lower layer and an upper layer.

The substrate includes at least a first and a second marker area. In each marker area, the lower layer is patterned with a first periodic structure and the upper layer is patterned with a second periodic structure, different from the first periodic structure. A combination of the first and second periodic structures forms a diffractive structure in each marker area. The first and second periodic structures in the first marker area are shifted in a predetermined direction by a predetermined amount. The first and second periodic structures are shifted differently with respect to each other in the second marker area.

Each diffractive structure is illuminated with electromagnetic radiation and a differential signal strength of radiation diffracted from the diffractive structure detected, the differential signal strength being a measure of a shift between the first and the second periodic structure in the illuminated marker area.

A relationship between predefined shift and differential signal strength is determined, based on detected values of differential signal strength on all diffractive structures, employing a linearization technique.

The shift is calculated for which the differential signal strength reaches a maximum value, based on the determined relationship between the predefined shift and the differential signal strength.

Alignment settings of the lithographic system are adapted to the calculated value.

The invention further relates to a device manufacturing method using such a method.

The invention further relates to a lithographic system, arranged to project a pattern from a patterning device onto a substrate, employing such a method.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
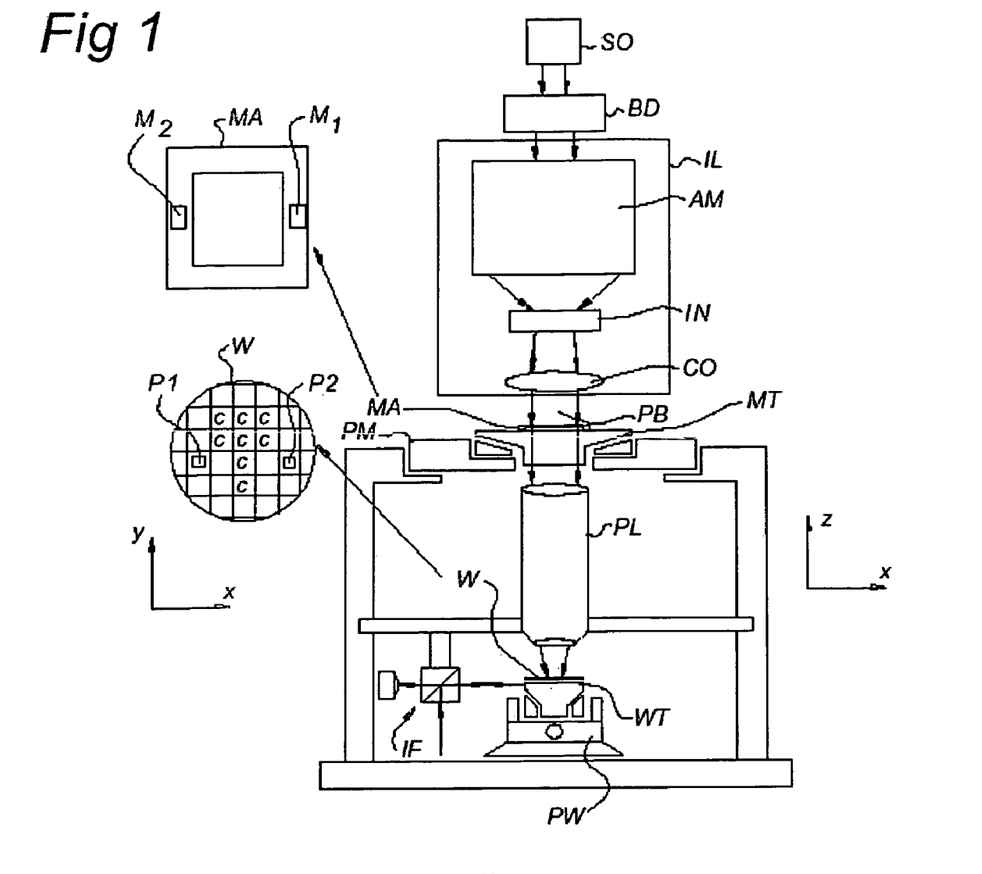
FIG. 1 depicts a lithographic apparatus, which may use an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example, with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

FIG. 2 shows a state-of-the-art overlay marker structure that is widely used in overlay measurements. This pattern, called "bar-in-bar" comprises a pair of four lines 1a-d, 2a-d, the so-called bars, forming two squares surrounding each other without corners. The large, outer bars 1a-d are associated with a first layer, while the small, inner bars 2a-d are associated with a second layer. Typically the outer bars 1a-d are patterned on a lower layer, while the inner bars 2a-d are patterned in an upper layer above the lower layer. Lower generally corresponds to earlier and upper to later in the processing of a substrate respectively. The center positions of both the four inner (2a-d) and outer (1a-d) bars should coincide to establish a perfect alignment, i.e. the overlay is zero. However, the exact center position is hard to determine. As a result of processing steps between patterning of the lower and upper layer, the overlay targets in both layers may deteriorate. For instance, chemical mechanical planarization (CMP) is a widely used technique to planarize a substrate surface as an intermediate processing step before providing a new layer. However, CMP may enhance small imperfections of a pattern structure. When, for instance, the slope of the left wall of outer bar 1a is different than the slope of its right wall, CMP will change the center position of the outer bar 1a. Consequently, the center position of the overlay target in this layer changes resulting in an incorrect determination of the overlay.

Figure 3A:
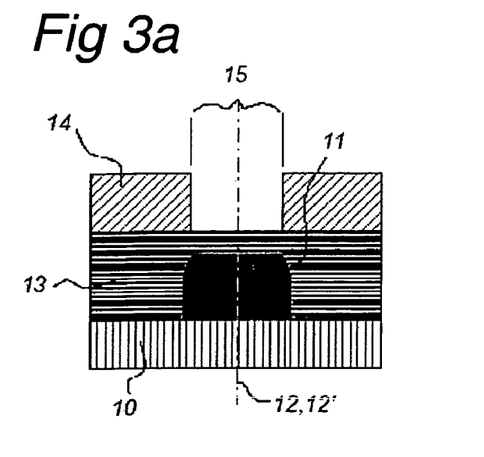
FIGS. 3a and 3b show a cross-sectional view of an aligned and a misaligned contact-to-poly arrangement, respectively.
Figure 3B:
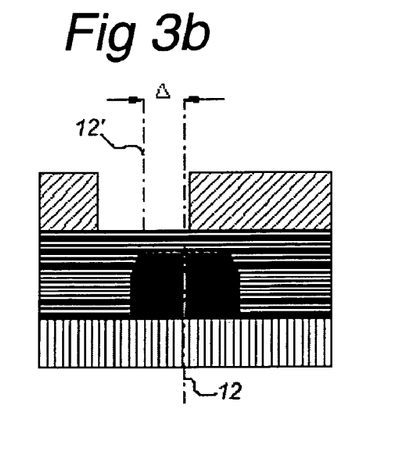

The use of an overlay marker structure as the one shown in FIG. 2 becomes even more unfavorable, when the structures in the layers to be aligned are different than the overlay marker structure. To demonstrate this, the following well-known arrangement of layers, schematically shown in FIGS. 3a, 3b is used. This configuration is known as contact-to-poly. A first layer 13 in this arrangement of layers comprises a structure 11, a so-called poly-gate, on top of a surface 10, which is either the substrate to be patterned or an earlier layer that has been developed. In this case, poly-gate 11 is a bar-like structure. Generally, poly-gate 11 is embedded in the first layer 13 for isolation. Sequentially, a second layer 14 comprising a plurality of apertures 15, so-called contact holes, is positioned on top of protective layer 13. To operate the poly-gate 11, which is a component used in an electrical circuit, the contact hole 15, which later will be filled with a metal to serve as an electrical contact, must be positioned on top of the poly-gate 11. In this example, the best control, thus the desired position of the poly-gate 11, is established when contact hole 15 is placed exactly on top of poly-gate 11, as is shown in FIG. 3a. In this case, center line 12 through poly-gate 11 coincides with center line 12' through contact hole 15. However, in reality both center lines 12, 12' will generally not overlap, as is depicted in FIG. 3b. In these cases, there is a mismatch, also referred to as an overlay-error Δ.

Overlay errors may have different origins. The substrate to be processed may have shifted in between different processing steps due to some unintended translation, rotation, tilt or any combination of these effects. Besides these misalignments at the substrate level, an overlay error may also be caused by a misalignment at a pattern structure level. The properties of optical elements within the projection optics may slightly change over time, e.g. the magnification of the projection optics alters. Consequently, pattern structures may become larger or smaller than desired. Additionally, the interaction of the projection beam with the optical elements in the projection optics may vary for different shapes and sizes of pattern structures.

Overlay measurement systems and methods therefore require techniques that are capable of measuring both at the substrate level and at the structure level. A well-known technique, which is commonly used in metrology, that addresses these two levels is phase-grating alignment.

Figure 4:
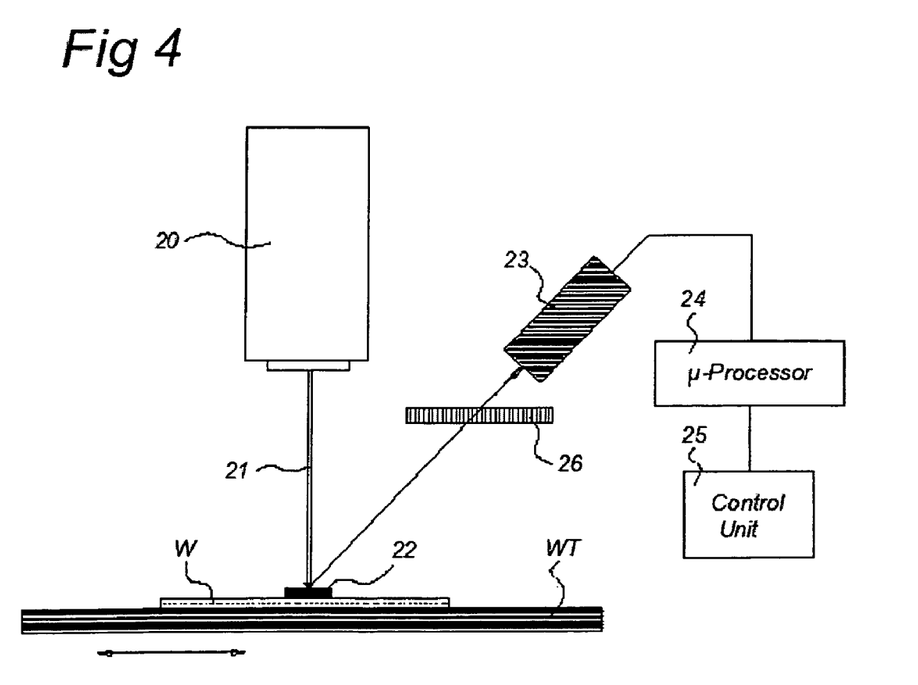
FIG. 4 shows a prior art phase-grating alignment system adapted for an embodiment of the present invention.

FIG. 4 depicts a phase-grating alignment system adapted for use with the invention. The alignment system comprises a light source 20, which directs a light beam 21 towards a suitable diffractive structure 22 to be exposed. For instance, an overlay marker structure may include a phase-grating that is placed on a substrate W. The alignment system may include a substrate table WT and at least one detector 23. The detector 23 may be coupled to a (micro)processor 24. The light beam 21 diffracts at the diffractive structure 22 positioned on the surface of the substrate W into several diffraction orders such as +1, −1, +2 and −2. The light beam 21 may be directed perpendicular to the substrate W, as shown in FIG. 4, but may also be directed towards the substrate W at an angle. The phase grating alignment system may then use each set of corresponding diffraction orders (say +1 and −1) to form an image of the diffractive structure 22 on a reference plate 26. The reference plate 26 may include reference gratings for each set of corresponding diffraction orders to be measured. Behind each reference grating, a separate detector 23 may be arranged to measure the intensity of the radiation in the image passing through the reference gratings. By moving the diffractive structure 22 relative to the reference plate, the position with the highest intensity for one or more images is found, which gives the aligned position. The performance of the alignment system may be further enhanced by employing two wavelengths, as is done in a so-called "Athena-sensor," disclosed in J. H. M. Neijzen et al., "Improved Wafer Stepper Alignment Performance using an Enhanced Phase Grating Alignment System, Proceedings SPIE, vol. 3677 (1999), pp. 382-394, and incorporated herein by reference.

Generally, the wavelength of the light beam 21 emitted by the light source 20 of a phase-grating alignment system is larger than the wavelength of the exposure beam of radiation employed by the lithographic apparatus to project a pattern on a substrate W. A phase-grating alignment system typically uses light with a wavelength between 400-700 nm. For example, the Athena sensor uses two light beams with wavelengths of about 533 nm (green) and 633 nm (red), respectively. An optical lithographic apparatus on the other hand, generally uses light with a wavelength ranging from ultraviolet (UV), e.g. about 365, 355, 248, 193, 157 or 126 nm, down to extreme ultra-violet (EUV), about 5-20 nm.

Figure 5A:
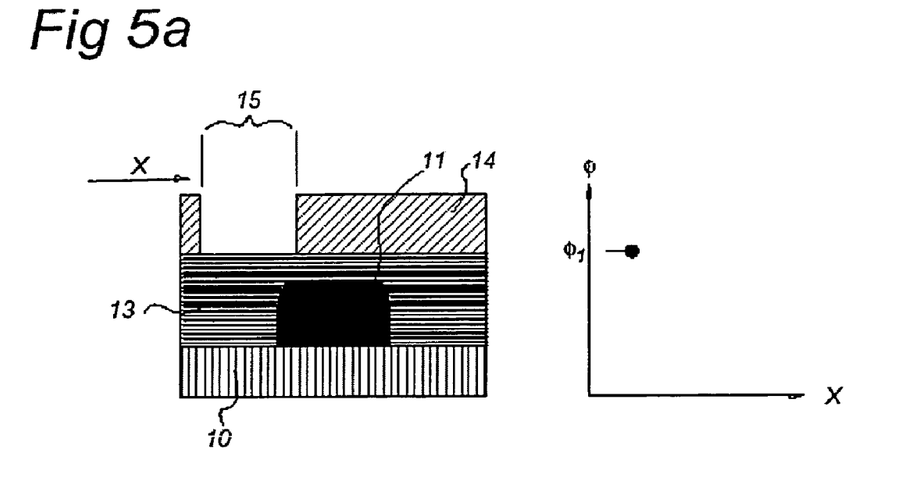
FIGS. 5a-5c show a cross-sectional view of a contact-to-poly arrangement with different overlay errors (left hand side) and corresponding effects on optical phase depth of a plurality of similar arrangements (right hand side)
Figure 5B:
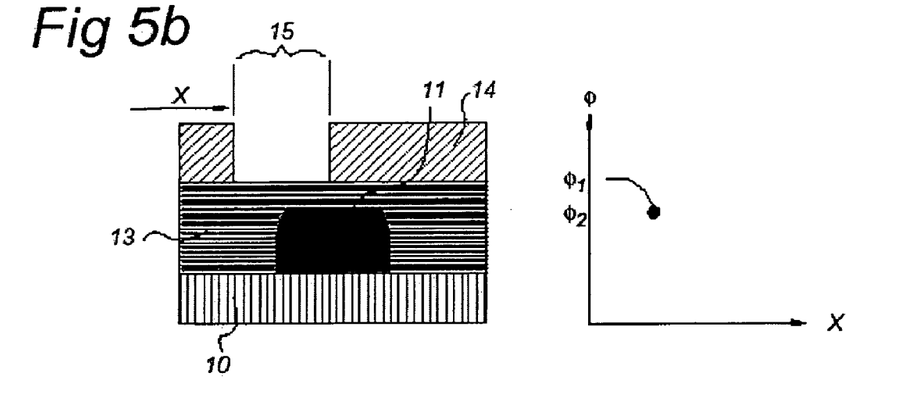
Figure 5C:
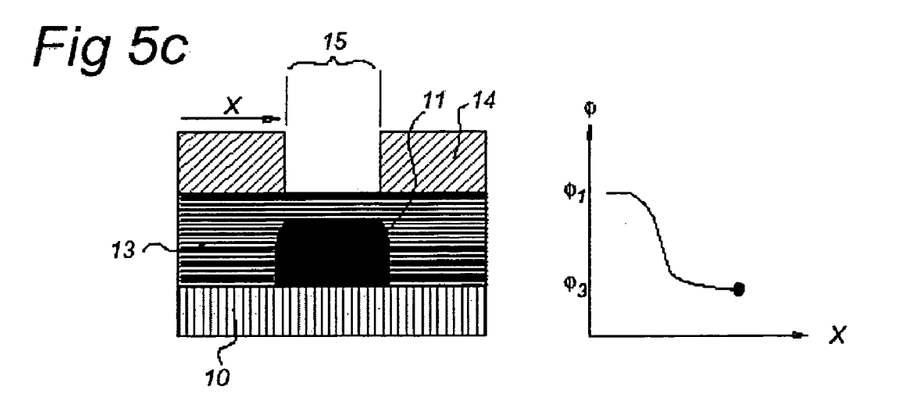

FIGS. 5a, 5b, 5c schematically show a cross-sectional view of different configurations of a poly-gate 11 and a contact-hole 15 as explained and depicted in FIG. 3a in combination with graphs of optical phase depth $\Phi(x)$ as a function of position x of contact hole 15 (right hand side) in a predefined direction. The optical phase depth may be regarded as a convolution of both structures. It linearly depends on the depth of the material that the light is directed upon and the refraction index of the material and is inversely proportional to the wavelength of the light that is used. In FIG. 5a, both structures 11, 15 are completely misaligned. As a result, optical phase depth $\Phi(x)$ remains constant at $\Phi_1$. At the edge of poly-gate 11, i.e. the edge of poly-gate 11 is below the contact-hole 15, $\Phi(x)=\Phi_2$. When the edge of poly-gate 11 is below the contact-hole 15, $\Phi(x)$ strongly depends on position x, as depicted in FIG. 5b. When both structures are aligned, as shown in FIG. 5c, the optical phase depth $\Phi(x)$ remains constant again at a level $\Phi_3$. Generally, a plurality of poly-gates 11 and contact holes 15 are positioned on top of each other. Since the pitch, i.e. the distance between two adjacent sets of identical structures, like the set of structures 11, 15, is substantially the same, a plurality of aforementioned configurations with the same positional offset is created. The variation of optical phase depth $\Phi(x)$ as a function of position x can now be translated into a variation of reflectivity within the area provided with the plurality of aforementioned poly-gates 11 and contact holes 15. This property is employed by the invention.

Figure 6A:
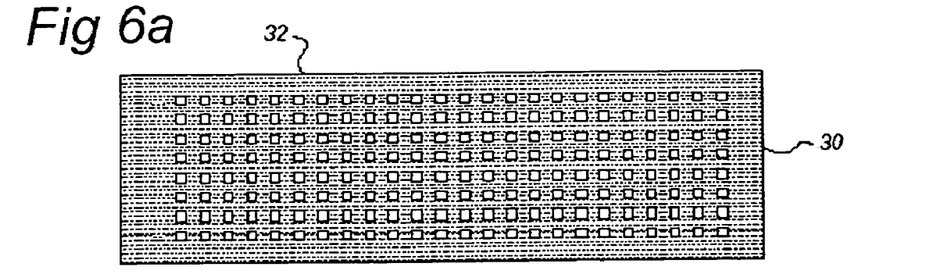
FIG. 6a shows a first layer of an overlay marker structure according to a first embodiment of the present invention.
Figure 6B:
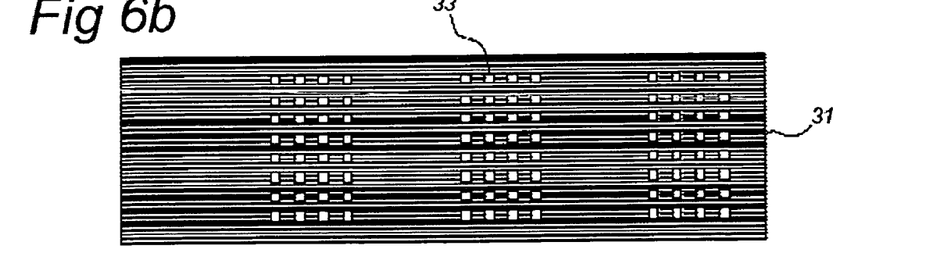
FIG. 6b shows a second layer of an overlay marker structure according to a first embodiment of the invention.
Figure 6C:
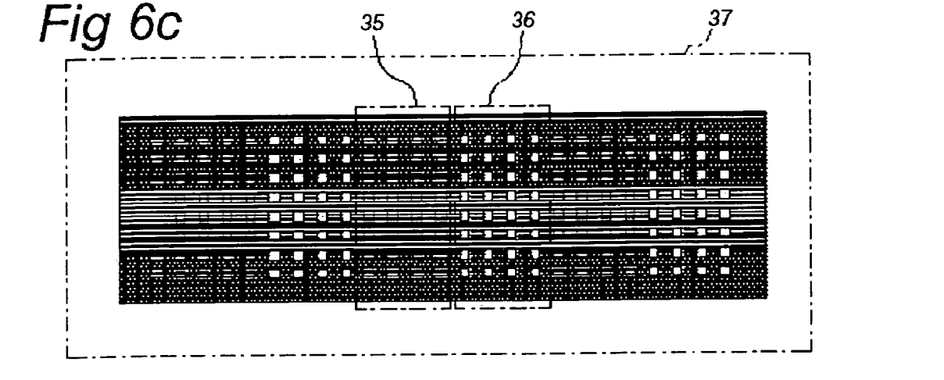
FIG. 6c shows a top view of the first layer and the second layer of FIGS. 6a and 6b placed on top of each other.

FIGS. 6a, 6b, 6c show an example of an overlay marker structure according to a first embodiment of the invention. It uses the aforementioned reflectivity property by creating a diffractive marker structure by alternating areas with different reflectivity, caused by aforementioned convolution of a plurality of structures in different layers. The marker structure comprises two periodic structures. A first periodic structure is provided in a first layer 30 (shown in FIG. 6a), and a second periodic structure is provided in a second layer 31 (shown in FIG. 6b), which will be positioned above the first layer 30, as shown in FIG. 6c. Second layer 31 may be located directly on top of first layer 30. However, one or more intermediate layers may be provided between the first layer 30 and the second layer 31. The one or more intermediate layers may protect the structures within the first layer 30 or may ensure a sufficient electric coupling between pattern features in both layers 30, 31, as is known to someone skilled in the art.

In this example, the first periodic structure comprises a plurality of squares 32 with a different reflective surface than its surrounding, denoted by the non-dotted interior areas of the squares 32. The second periodic structure in this example comprises a layer with a plurality of squared apertures 33. At the position of the apertures 33, the layer has different optical properties with respect to its surroundings, which is denoted by the non-dotted interior areas of the squared apertures 33.

When placed on top of each other, as shown in FIG. 6c, the two layers 30, 31 form an overlay marker structure 37. Due to the difference in structure, two areas 35, 36 with different optical properties are formed. Since these two areas 35, 36 are formed in a repetitious manner, a grating structure is created. By using results of measurements performed on the grating, for instance, by using a phase-grating alignment system, an overlay error can be determined. The squares 32 and squared apertures 33 are preferably produced using the lithographic apparatus itself, i.e. using the wavelength of the exposure light beam smaller than 400 nm. So, the squares 32 and squared apertures 33 can be said to be "at resolution" of the lithographic apparatus. However, the grating structure is not "at resolution". It has "macroscopic" dimensions, i.e. dimensions with a typical length that exceed the exposure wavelength employed by the lithographic apparatus. Instead, its dimensions are suitable for a phase-grating alignment system, which typically uses light with a wavelength between 400-1000 nm.

It should be understood that the shape of the shown features is only chosen to explain the invention, and not to limit its scope. A major advantage of the present invention is that many other shapes are possible. The first layer 30 may, for instance, include a periodic structure comprising a plurality of poly-gates 11, which generally have a rectangular shape. The second layer 31 may, for instance, include a "via-layer", i.e. a layer comprising a plurality of contact holes 15, generally with a circular shape. Note that both layers 30, 31 may comprise a periodic structure with pattern features at resolution, i.e. with the same dimensions as the pattern features generally created with the lithographic system. Even a part of an actual integrated circuit structure, when periodic, may thus be a suitable periodic structure. It is thus possible to use measurement techniques known in the art to determine an overlay error on diffractive structures with "macroscopic" dimensions, while both layers to be aligned are provided with pattern features "at resolution". Furthermore, the overlay marker structure of the invention has the further advantage that deterioration of the pattern features "at resolution" by intermediate processing steps, will have a negligible effect on the diffraction characteristics of the "macroscopic" diffractive structure, thus resulting in a correct determination of an overlay error. Alternatively, if the first layer is provided with the second periodic structure as shown in FIG. 6b, and the second layer is provided with the first periodic structure as shown in FIG. 6a, a diffractive structure according to an embodiment of the present invention may be formed.

FIG. 6c shows a grating in a horizontal direction. It should be understood that a grating of the invention may also be directed in a vertical or diagonal direction. Furthermore, an overlay marker structure of the invention may comprise a combination of horizontal, vertical and diagonal gratings, formed in a similar fashion, as can easily be understood by people skilled in the art.

Figure 7:
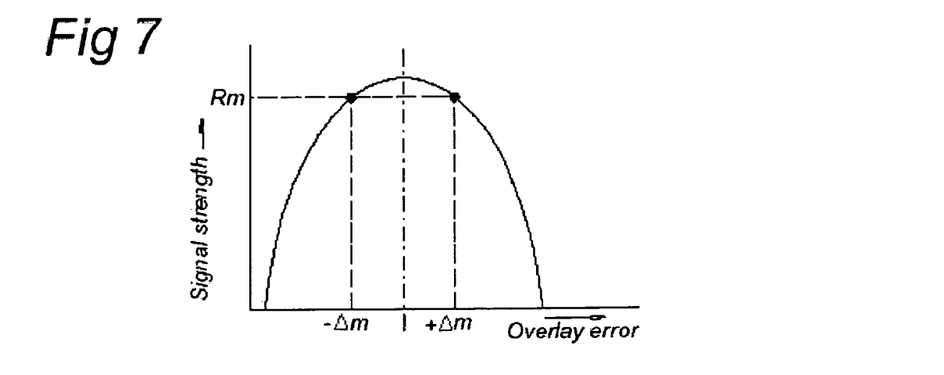
FIG. 7 shows a graph representing measured signal strength as a function of an overlay error.

FIG. 7 shows a graph representing a signal strength as a function of an overlay error $\Delta$, for instance, an intensity of one or more diffraction orders measured by an optical detection apparatus, such as a phase grating alignment system. An overlay marker structure as shown in FIG. 6c, i.e. with an overlay error of zero, includes a diffractive structure, in this case a grating, with sharp edges and perfect periodicity resulting in a maximum signal strength. However, an overlay error $\Delta$ between the two layers 30, 31 will result in a different diffractive structure, as for instance shown in FIG. 8a, which shows an overlay marker structure of the invention provided with an imposed overlay error $\Delta_{imp}$. Consequently, diffractive orders will become less distinct and the signal strength, measured with the optical detection apparatus, will be smaller.

To apply the overlay measurement technique, as shown in FIG. 6c, on a single overlay marker structure has a major disadvantage. It may determine an absolute value for overlay error $\Delta$. A single measurement does not reveal in what direction the measured overlay error is established. As a result, it is unknown in what direction the alignment error between the two layers 30 and 31 should be corrected for. For example, the signal strength, measured by the optical detection apparatus, is $R_m$ as shown in FIG. 7. There are then two possible corresponding overlay errors that may cause the decreased signal strength, i.e. $+\Delta_m$ and $-\Delta_m$.

Figure 8A:
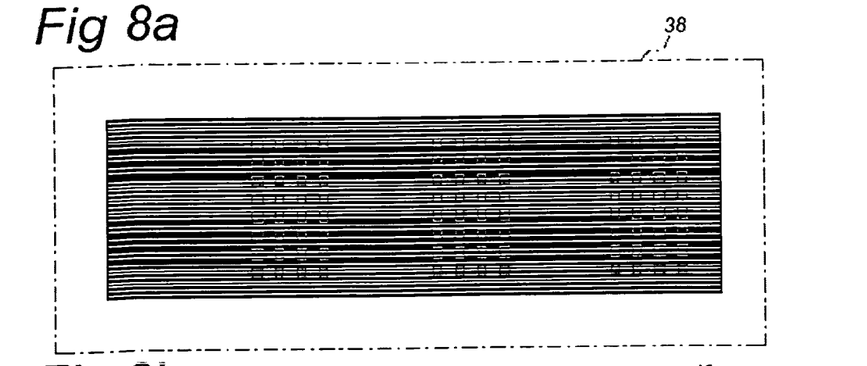
FIG. 8a shows an example of an overlay marker structure according to a second embodiment of the invention.

To avoid this uncertainty problem, a second overlay marker structure with an imposed overlay error $\Delta_{imp}$ may be provided, e.g. an overlay marker structure 38 according to a second embodiment of the present invention as shown in FIG. 8a. Consider, for example, the overlay marker structure measured upon in FIG. 7. Applying an imposed overlay error $+\Delta_{imp}$ will result in a different measured signal strength. A positive shift means that the measured signal strength of the new configuration lies on the curve in the direction of the arrows, i.e. to the right hand side of the original measurement result in FIG. 7. Now, if the measured signal strength increases, the original overlay error between the two layers 30, 31 would have been $-\Delta_m$, while a decrease of signal strength indicates that the original overlay error was $+\Delta_m$. The combined use of overlay marker structures 37, 38 or the use of more overlay marker structures 38 with a different imposed overlay error $\Delta_{imp}$ thus enables determination of both the absolute value and the 'sign' of the overlay error $\Delta$ between the two layers 30, 31. Consequently, overlay error correction becomes easier.

Figure 8B:
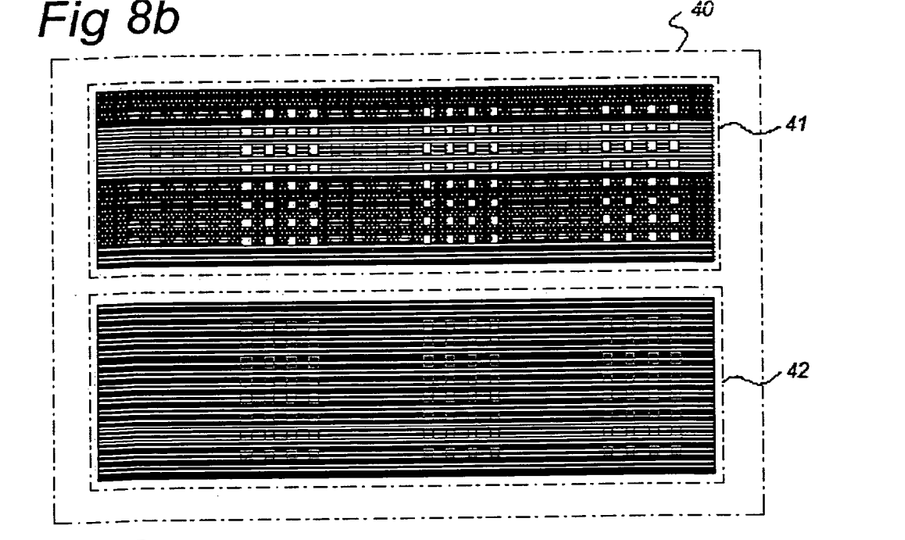
FIG. 8b shows an example of an overlay marker structure according to a third embodiment of the invention.

In FIGS. 6 and 8, the elements used to form the marker structures are both squares. However, in the shown embodiments, a shift perpendicular to the direction of the grating, also changes the diffractive properties of the marker structure. In reality, poly-gates 11 are rectangular. When a contact hole 15 is positioned on top of such a poly-gate 11, the direction in which the segments alternate, corresponds with the width of the poly-gate 11, while a direction perpendicular thereto corresponds with the length of the poly-gate 11. As a result, the signal strength is more sensitive to shifts in the direction of alternating segments than in a direction perpendicular thereto. It is therefore beneficial to provide at least two marker structures, each having an optimal sensitivity in a different direction. Preferably, these directions are perpendicular to each other.

Overlay marker structures 37, 38, as shown in FIGS. 6c and 8a, respectively, may also be combined to form a single overlay marker structure 40, as depicted in FIG. 8b, showing an example of an overlay marker structure according to a third embodiment of the invention. Two or more overlay marker structures 38 with a different imposed overlay error may be combined to form a single marker structure (not shown). Overlay marker structure 40 comprises two segments 41, 42. It should be understood that the number of segments is only chosen for explaining this embodiment of the invention. An overlay marker structure according to this embodiment of the invention may thus comprise more than two segments, for instance three, four, or more segments. In both segments 41, 42, a diffractive structure is formed in a fashion in accordance with the invention as described above. Within each segment a different imposed overlay error $\Delta_{imp}$ may be imposed, resulting in a different diffractive structure per segment. For instance, segment 41 of overlay marker structure 40, shown in figure 8b, comprises a diffractive structure similar to the diffractive structure of overlay marker structure 37 of FIG. 6c. Segment 42 of overlay marker structure 40 comprises a diffractive structure similar to the diffractive structure of overlay marker structure 38 of FIG. 8a. Measurements on these different diffractive structures within a single overlay marker structure 40 with a phase-grating alignment system in a way as known in the art, enables the determination of an overlay error Δ including its "sign". The use of a single marker structure with a number of segments has the advantage that the measurement can be performed using a single phase-grating alignment within a short period of time.

In lithographic processing, it is desirable to be able to determine an overlay error as early as possible, and moreover, to compensate for misalignment in the process in an early stage. Generally, an overlay between two layers is determined off line and after processing a number of substrates by employing some kind of metrology technique.

An overlay marker structure of the invention provides the ability to use a method to align layers in a multi-layer substrate in an earlier stage of development. The method enables an increase of device yield by compensating for an overlay error, without an exact determination of its value and direction. In this method, measurements on at least two different diffractive structures, like gratings, that are provided on the multi-layer substrate, are performed with an optical detection apparatus, like a phase grating alignment system as shown in FIG. 4. The difference between the diffractive structures originates from a different imposed overlay error $\Delta_{imp}$ per diffractive structure. The diffractive structures may be provided by distinct overlay marker structures located at distinct positions on the multi-layered substrate. For instance, overlay marker structures like overlay marker structures 37, 38, shown in FIGS. 6c and 8a respectfully, may be used. However, the different diffractive structures may also be provided by a single overlay marker structure like overlay marker structure 40, as shown in FIG. 8b. Of course, any combination of the aforementioned options is also possible.

Figure 9:
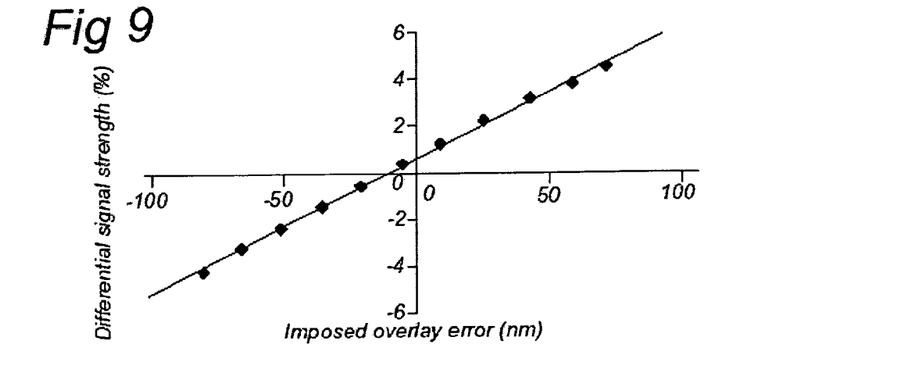
FIG. 9 shows a data plot of calculated differential signal strength for several predefined imposed overlay errors (dots) and a line graph defining a measured relation between these two parameters.

In the method to align layers in a multi-layer substrate, the measurements on the different diffractive structures are used to establish a relationship between the imposed overlay error and a differential signal strength. As illustrated in FIG. 7, the maximum signal strength obtainable on an overlay marker structure coincides with perfectly aligned layers. A less than maximum measured signal strength may indicate an overlay error that is compensated based on the sign determined by the technique explained. By plotting the differential signal strength per measurement as a function of the imposed overlay error per diffractive structure, a data plot as depicted in FIG. 9 may be obtained. By using some kind of linearization technique, e.g. a least squares error fit, a line as shown in FIG. 9 can be determined. This line describes the measured relationship between the two parameters. As known from FIG. 7, a maximum signal strength corresponds with an overlay error of zero. Thus, at the point where the drawn line crosses the horizontal axis, there is supposed to be no overlay error.

Figure 10:
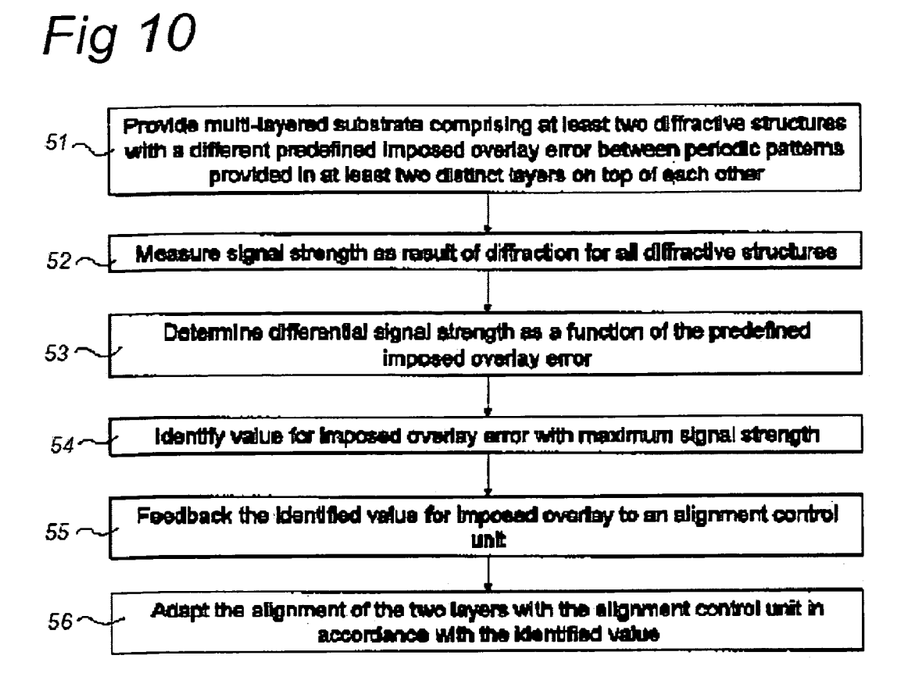
FIG. 10 shows a schematic block diagram explaining a method for controlling alignment of layers in a multi-layer substrate in accordance with the present invention.

The invention applies this technique in a method to control the alignment of layers in a multi-layered substrate in a lithographic system following a procedure as depicted in the schematic block diagram of FIG. 10. First, a multi-layered substrate comprising at least two marker areas, in which each marker area comprises a different diffractive structure, are provided in action 51. The diffractive structures are formed by combining periodic structures that are present in at least two distinct layers on top of each other. The difference between the diffractive structures originates from a different imposed overlay error between the at least two periodic structures of the at least two distinct layers. When aforementioned marker areas are adjacent to each other, each marker area may form a segment of a single marker structure as shown in FIG. 6c. In action 52, an optical detection apparatus, e.g. a phase-grating alignment system as shown in FIG. 4, then measures a property of the diffraction pattern like signal strength for all diffractive structures. Consecutively, in action 53, a relationship between the differential signal strength and the imposed predefined overlay error $\Delta_{imp}$ is determined in a processing unit, for instance microprocessor 24 in FIG. 4, by employing some type of linearization technique, e.g. a least squares linear fit. The processing unit then identifies in action 54 a value for the imposed overlay error at which the maximum signal strength is reached. The identified value is then fed back in action 55 to an alignment control unit, for instance control unit 25 in FIG. 4, which finally adapts, in action 56, the alignment settings of the two layers to be aligned in accordance with the value, identified by the processing unit.

Figure 11A:
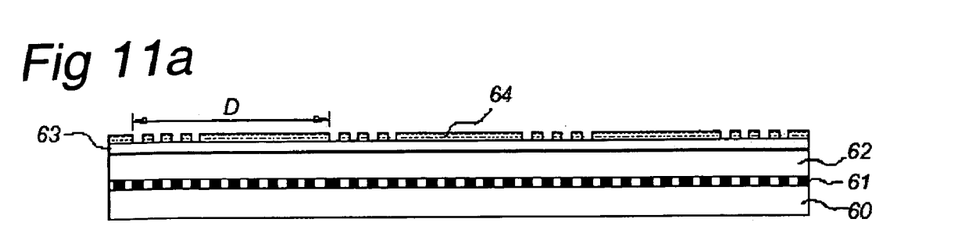
FIGS. 11a-c show a cross-sectional view and two top views, respectively, of a structure formed in a copper damascene process.
Figure 11B:
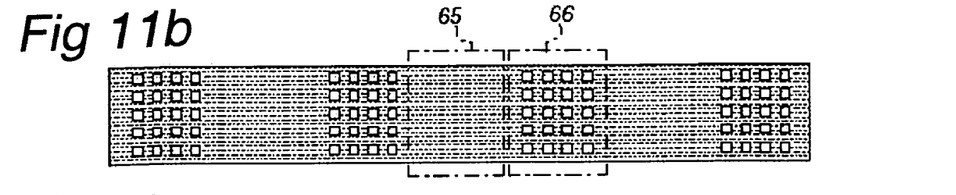
Figure 11C:
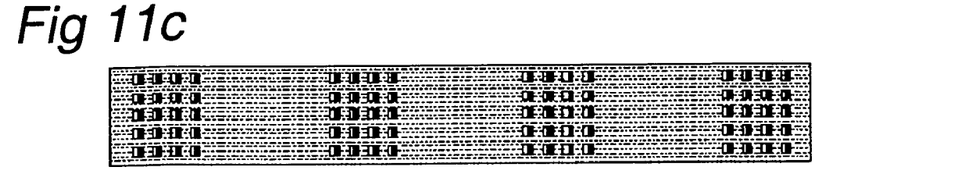

The description of the invention is explained so far by using an example wherein two layers, each with a different periodic structure, form a contact-to-poly structure. It should be understood that the invention is not limited to this structure. Many other configurations may benefit from the invention. For instance, the invention may also be employed for improving the overlay in copper damascene layers. To demonstrate this, FIGS. 11a-c show a cross-sectional view and two top views, respectively, of a structure formed in a copper damascene process that is suitable for overlay measurements according to the invention. The structure comprises a substrate provided with a number of layers. Typically, as shown in FIG. 11a, the substrate is among others covered by a first via layer 60 on top of which a patterned first metal layer 61 is provided. Consecutively, a second via layer 62 and a second metal layer 63 are formed, and finally a patterned resist layer 64 is created on top of aforementioned stack of layers 60-63.

As can be readily seen in the top view of FIG. 11b, the arrangement of layers forms alternating areas 65, 66 with different optical properties, thus creating a grating with a period D in a similar fashion as shown in FIG. 6c. FIG. 11c shows the consequences of a shift of the resist layer 64 with respect to the first metal layer 61. The properties of the created grating change.

In similar ways as described before with respect to the gate-to-poly structure, an overlay error may be determined and corrected for.

The invention may be employed both on-line and off-line in a lithographic apparatus. Furthermore, the invention is explained with reference to examples regarding a marker structure with a diffractive grating in one direction. It should be understood that, in general, similar marker structures may be used with a different direction for the diffractive grating e.g. one marker structure for the x-direction and one marker structure for the y-direction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

Although specific reference may be made to the term "grating", any type of diffractive structure may be formed by the combination of periodic structures.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

Other embodiments, uses and advantages of the invention will be apparent to those skilled in the art from consideration of the specification and practice of the invention disclosed herein. The specification should be considered exemplary only, and the scope of the invention is accordingly intended to be limited only by the following claims.

The invention claimed is:

1. A device, comprising:
a wafer positioned on a wafer table of a lithographic apparatus in a position for detecting light reflected off the wafer, the wafer comprising:
a first layer;
a second layer, wherein the second layer is placed over the first layer;
a first periodic structure formed on the first layer; and
a second periodic structure formed on the second layer, wherein at least one of the first periodic structure and the second periodic structure comprises a plurality of features having dimensions smaller than 400 nm and being oriented in at least one direction and wherein the second periodic structure is placed over the first periodic structure to form a diffractive structure.

2. The device according to claim 1, wherein the diffractive structure is divided into at least a first segment and a second segment, wherein the first and second periodic structures within the first segment are shifted relative to each other in a first predetermined direction by a first predetermined amount and wherein the first and second periodic structures within the second segment are shifted relative to each other in a second predetermined direction by a second predetermined amount.

3. The device according to claim 1, wherein one of said first and second periodic structures comprises a plurality of apertures.

4. The device according to claim 1, wherein one of said first and second layers is a device layer with a periodic structure comprising a device structure.

5. The device according to claim 1, wherein one of said first and second layers is a contact layer with a contact layer periodic structure comprising a plurality of contact holes, the other layer being a device layer with a device layer periodic structure comprising a plurality of gates.

6. The device according to claim 1, further comprising at least one non-patterned intermediate layer between said first layer and said second layer.

* * * * *